(12) United States Patent
Maemuko et al.

(10) Patent No.: US 10,757,847 B2
(45) Date of Patent: Aug. 25, 2020

(54) DISPLAY DEVICE

(71) Applicant: Japan Display Inc., Tokyo (JP)

(72) Inventors: Masanori Maemuko, Tokyo (JP);
Keiichi Kishida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/564,155

(22) Filed: Sep. 9, 2019

(65) Prior Publication Data
US 2020/0084922 A1 Mar. 12, 2020

(30) Foreign Application Priority Data

Sep. 10, 2018 (JP) ................................. 2018-168978

(51) Int. Cl.
| | | |
|---|---|---|
| *H05K 1/02* | (2006.01) | |
| *H05K 9/00* | (2006.01) | |
| *F21V 8/00* | (2006.01) | |
| *H01R 4/26* | (2006.01) | |
| *G02F 1/1333* | (2006.01) | |
| *H01R 4/30* | (2006.01) | |

(52) U.S. Cl.
CPC .......... *H05K 9/0054* (2013.01); *G02B 6/0081* (2013.01); *G02F 1/133308* (2013.01); *H01R 4/26* (2013.01); *H01R 4/308* (2013.01); *H05K 1/0215* (2013.01); *G02F 2001/133334* (2013.01)

(58) Field of Classification Search
CPC ............. G02B 6/0081; G02F 1/133308; G02F 2001/133334; H01R 4/26; H01R 4/308; H05K 1/0215; H05K 9/0054

See application file for complete search history.

(56) References Cited

U.S. PATENT DOCUMENTS

| | | | | |
|---|---|---|---|---|
| 5,014,160 A | * | 5/1991 | McCoy, Jr. .......... | H05K 9/0033 361/818 |
| 2002/0080298 A1 | * | 6/2002 | Fukayama .......... | G02F 1/13452 349/58 |
| 2003/0169383 A1 | * | 9/2003 | Kim ...................... | G02B 6/009 349/58 |

(Continued)

FOREIGN PATENT DOCUMENTS

| | | |
|---|---|---|
| JP | H09-170616 A | 6/1997 |
| JP | 2008-185764 A | 8/2008 |
| JP | 2010-212330 A | 9/2010 |

*Primary Examiner* — Evan P Dzierzynski
(74) *Attorney, Agent, or Firm* — K&L Gates LLP

(57) ABSTRACT

According to an aspect, a display device includes: a light source provided on a back surface side of a display panel; a printed circuit board provided on a back surface side of the light source; a shielding cover that covers the printed circuit board; a screwing member; and a projecting portion. A surface of the printed circuit board facing the shielding cover is provided with a ground pattern electrically coupled to the shielding cover. The ground pattern has a pattern-side through-hole therein, and the pattern-side through-hole penetrates the ground pattern and allows a screw member to pass therethrough. The shielding cover has a cover-side through-hole therein, and the cover-side through-hole overlaps the ground pattern and allows the screw member to pass therethrough. The screwing member is screwed onto the screw member. The projecting portion is provided in an area surrounding the cover-side through-hole and projects toward the ground pattern.

5 Claims, 5 Drawing Sheets

(56) References Cited

U.S. PATENT DOCUMENTS

| | | | |
|---|---|---|---|
| 2004/0233372 A1* | 11/2004 | Park | G02F 1/133308 349/149 |
| 2006/0170839 A1* | 8/2006 | Yamamoto | G02F 1/133308 349/58 |
| 2008/0123016 A1* | 5/2008 | Kwak | G02F 1/133308 349/59 |
| 2008/0180931 A1 | 7/2008 | Ogawa | |
| 2016/0255749 A1* | 9/2016 | Isaji | H05K 9/0015 361/752 |

* cited by examiner

DISPLAY DEVICE

CROSS-REFERENCE TO RELATED APPLICATIONS

This application claims priority from Japanese Application No. 2018-168978, filed on Sep. 10, 2018, the contents of which are incorporated by reference herein in its entirety.

BACKGROUND

1. Technical Field

The present disclosure relates to an electronic apparatus, such as a display device, that is provided with a shielding cover for shielding a printed circuit board.

2. Description of the Related Art

In electronic apparatuses, such as display devices, a metal shielding cover is used to shield electronic components mounted on a printed circuit board (refer to Japanese Patent Application Laid-open Publication No. 2008-185764).

Structures are known that fasten members to each other using, for example, a bolt (refer to Japanese Patent Application Laid-open Publication No. 2010-212330 and Japanese Patent Application Laid-open Publication No. 09-170616).

In the above-mentioned electronic apparatuses, a ground pattern of the printed circuit board is required to be electrically coupled to the shielding cover in a stable manner.

SUMMARY

According to an aspect, a display device includes: a light source provided on a back surface side of a display panel; a printed circuit board provided on a back surface side of the light source; a shielding cover that covers the printed circuit board; a screwing member; and a projecting portion. A surface of the printed circuit board facing the shielding cover is provided with a ground pattern electrically coupled to the shielding cover. The ground pattern has a pattern-side through-hole therein, and the pattern-side through-hole penetrates the ground pattern and allows a screw member to pass therethrough. The shielding cover has a cover-side through-hole therein, and the cover-side through-hole overlaps the ground pattern and allows the screw member to pass therethrough. The screwing member is screwed onto the screw member passing through the pattern-side through-hole and the cover-side through-hole. The projecting portion is provided in an area surrounding the cover-side through-hole and projects toward the ground pattern.

DETAILED DESCRIPTION

Figure 1:
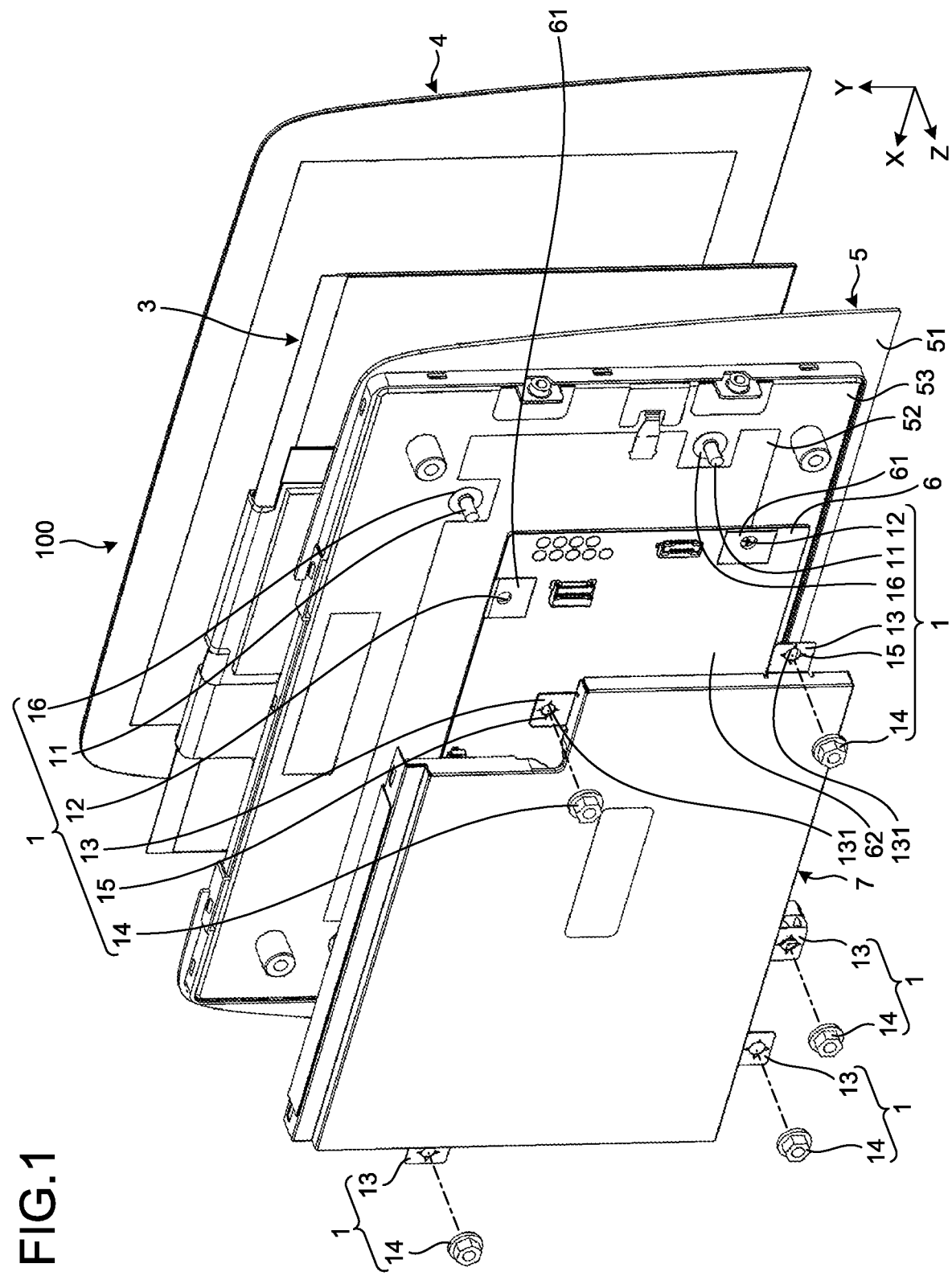
FIG. 1 is an exploded perspective view of a display device according to an embodiment of the present disclosure.

The following describes a mode (embodiment) for carrying out the present disclosure in detail with reference to the drawings. The present disclosure is not limited to the description of the embodiment to be given below. Components to be described below include those easily conceivable by those skilled in the art or those substantially identical thereto. Moreover, the components to be described below can be combined as appropriate. The disclosure is merely an example, and the present disclosure naturally encompasses appropriate modifications easily conceivable by those skilled in the art while maintaining the gist of the disclosure. To further clarify the description, widths, thicknesses, shapes, and the like of various parts are schematically illustrated in the drawings as compared with actual aspects thereof, in some cases. However, they are merely examples, and interpretation of the present disclosure is not limited thereto. The same element as that illustrated in a drawing that has already been discussed is denoted by the same reference numeral through the description and the drawings, and detailed description thereof will not be repeated in some cases where appropriate.

In this disclosure, when an element is described as being "on" another element, the element can be directly on the other element, or there can be one or more elements between the element and the other element.

FIG. 1 is an exploded perspective view of a display device according to the present embodiment. A display device 100 is mounted, for example, on a dashboard of a vehicle, and used for, for example, navigation display in a vehicle navigation system, display of a music operation screen, playing display of a movie, or instrument display such as speed display. As illustrated in FIG. 1, the display device 100 includes a display panel 3, a front case 4, a backlight unit 5 serving as a light source, a printed circuit board 6, and a shielding cover 7.

The display panel 3 is a liquid crystal display panel that includes two light-transmitting substrates and liquid crystals sealed between the two light-transmitting substrates. The display panel 3 displays an image by varying optical transmittances of respective pixels based on image signals. An X-direction denotes one direction in a plane of the display panel 3; a Y-direction denotes a direction orthogonal to the X-direction in the plane of the display panel 3; and a Z-direction denotes a direction orthogonal to the XY-plane. In this specification, a display surface side (or upper surface side) denotes a side having a display region (or upper surface) on which the display panel 3 displays an image, when viewed in the Z-direction, and a back surface side (or lower surface side) denotes a side having a back surface (or lower surface) on the opposite side of the display surface (or upper surface), when viewed in the Z-direction.

One end of a flexible printed circuit (hereinafter, called "FPC") board is coupled to the display panel 3. The other end of the FPC board is coupled to the printed circuit board 6 for transmitting a control signal to the display panel 3 to control a display operation. A protective cover may be disposed on the display side of the display panel 3. The protective cover is a light-transmitting member for covering the display surface of the display panel 3 to protect the surface. Examples of the light-transmitting member include glass, a light-transmitting resin member, and a touchscreen panel.

The backlight unit 5 is provided on a reverse surface (back surface on the opposite side of the surface on which the display panel 3 displays an image when viewed in the Z-direction) side of the display panel 3. The backlight unit 5 emits light toward the display panel 3 to make the light incident on the entire surface of the display region. The backlight unit 5 includes a backlight body 51 and a back plate 52. The backlight body 51 includes a light-emitting element such as a light-emitting diode and a light guide plate for guiding the light emitted from the light-emitting element to output the light toward the reverse surface of the display panel 3, and the back plate 52 is a sheet metal mounted on the back surface side of the backlight body 51. The back plate 52 is formed by blanking and bending a metal plate-like member. An insulating film 53 made of a synthetic resin having an insulating property is laminated on a part of a surface on the back surface side of the back plate 52 facing the printed circuit board 6.

The printed circuit board 6 is provided on the back surface side of the back plate 52 of the backlight unit 5 opposite to a side facing the display panel 3. One end of a flexible printed circuit (hereinafter, called "FPC") board (not illustrated) is coupled to the printed circuit board 6. The other end of the FPC board is coupled to the backlight body 51 of the backlight unit 5.

The back surface side of the printed circuit board 6 is provided with a plurality of ground patterns 61 coupled to a reference potential of the printed circuit board 6. The ground patterns 61 are provided on a surface of the printed circuit board 6 facing the shielding cover 7 and are electrically coupled to the shielding cover 7. The back surface side of the printed circuit board 6 is covered with an insulating film 62 having an insulating property, and the insulating film 62 exposes at least the ground patterns 61. In the present embodiment, the ground patterns 61 are exposed without being covered with the insulating film 62 and have each a rectangular planar shape.

The shielding cover 7 is a component for shielding electronic components mounted on the printed circuit board 6. The shielding cover 7 is fastened in a state of covering the back surface side of the printed circuit board 6. The shielding cover 7 is formed by blanking and bending a metal plate-like member.

Figure 2:
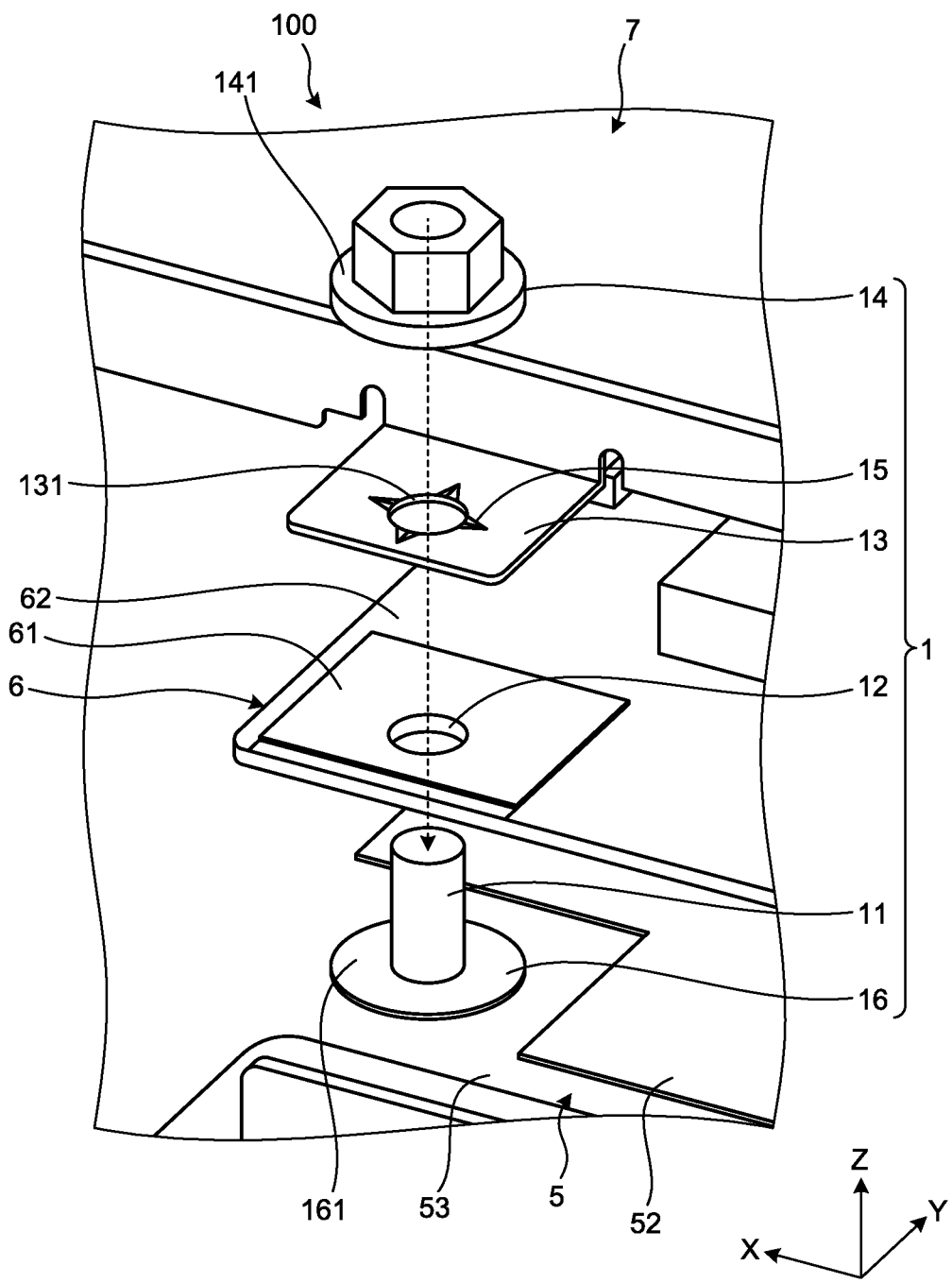
FIG. 2 is a perspective view illustrating a coupling portion of the display device illustrated in FIG. 1 in an exploded manner.
Figure 3:
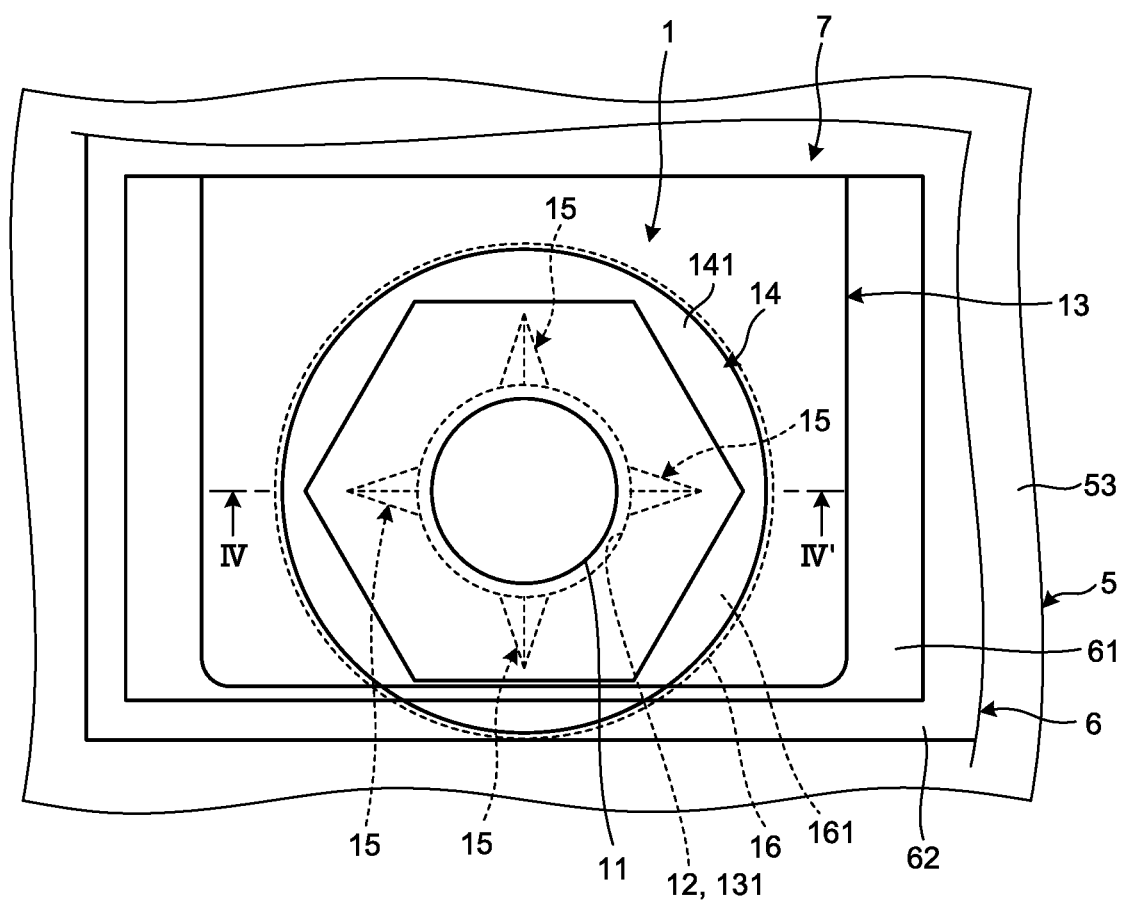
FIG. 3 is a plan view of the coupling portion illustrated in FIG. 2.
Figure 4:
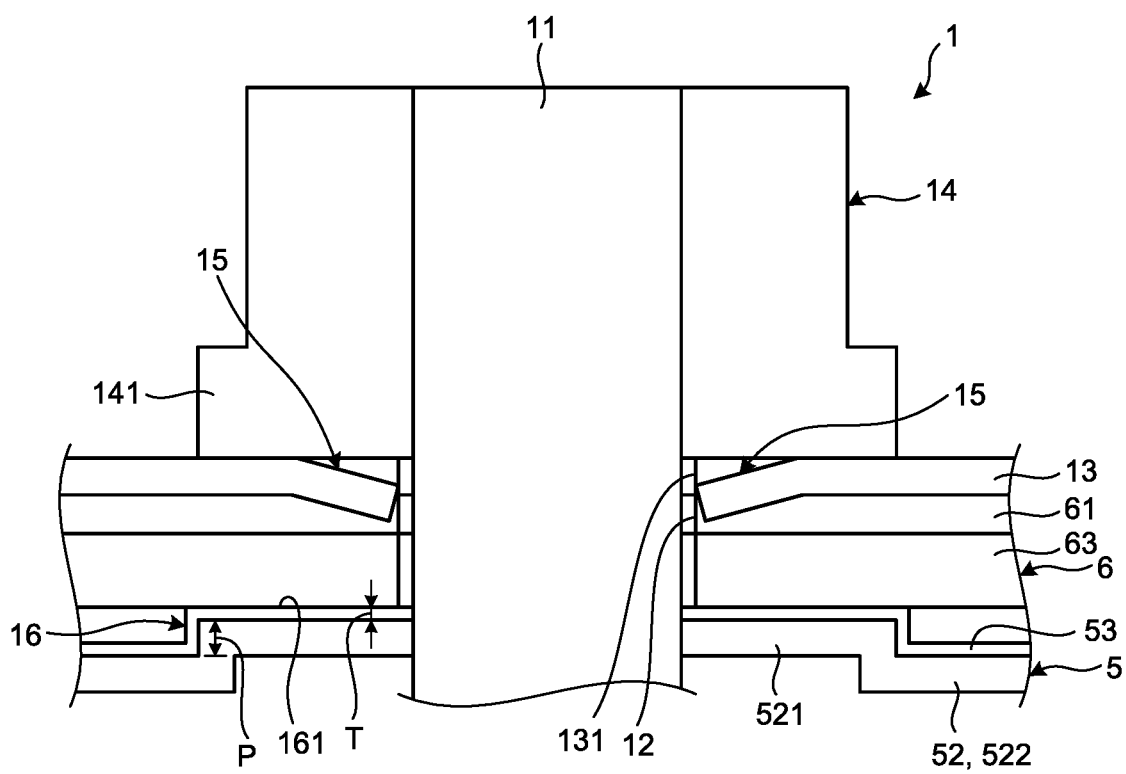
FIG. 4 is a sectional view for schematically explaining a section along IV-IV' of FIG. 3.
Figure 5:
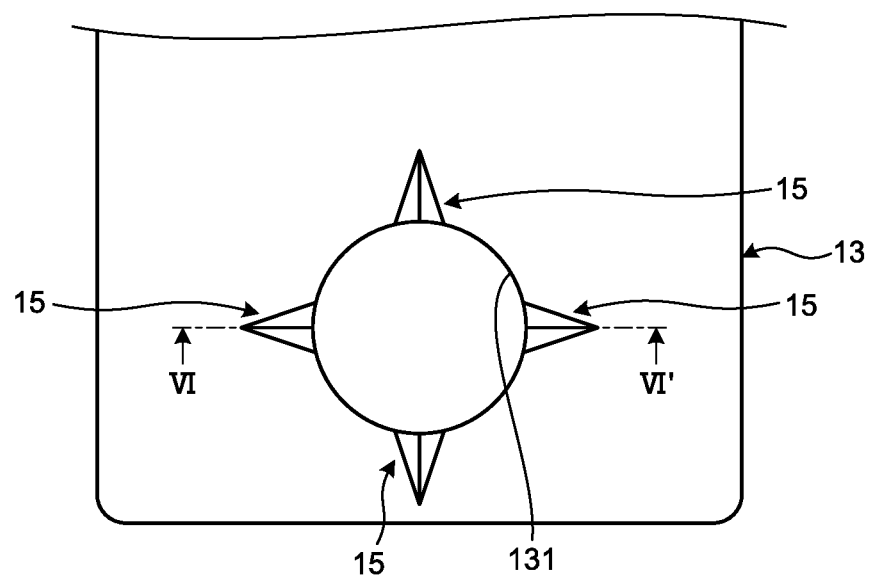
FIG. 5 is a plan view of a cover-side coupling piece of the coupling portion illustrated in FIG. 2.
Figure 6:
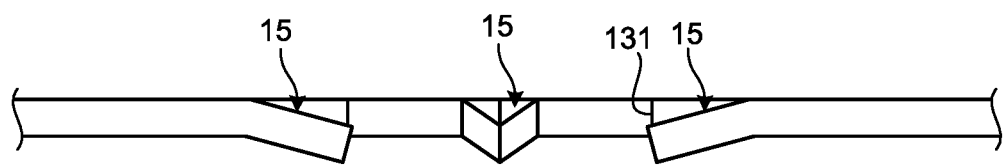
FIG. 6 is a sectional view for schematically explaining a section along VI-VI' of FIG. 5.

The display device 100 also includes coupling portions 1 for electrically coupling the ground patterns 61 to the shielding cover 7. In the present embodiment, the display device 100 includes the same number of the coupling portions 1 as that of the ground patterns 61. FIG. 2 is a perspective view illustrating each of the coupling portions of the display device illustrated in FIG. 1 in an exploded manner. FIG. 3 is a plan view of the coupling portion illustrated in FIG. 2. FIG. 4 is a sectional view for schematically explaining a section along IV-IV' of FIG. 3. FIG. 5 is a plan view of a cover-side coupling piece of the coupling portion illustrated in FIG. 2. FIG. 6 is a sectional view for schematically explaining a section along VI-VI' of FIG. 5.

As illustrated in FIGS. 2, 3, and 4, the coupling portion 1 has a screw member 11, a pattern-side through-hole 12, a cover-side coupling piece 13, a nut 14 serving as a screwing member, a projecting portion 15, and a step portion 16.

The screw member 11 is fixed to the backlight unit 5 and is provided so as to stand parallel to the Z-direction from the backlight unit 5 toward the printed circuit board 6. The screw member 11 is formed into a cylindrical shape and has a thread groove formed on an outer circumferential surface thereof. The screw member 11 is disposed in a position overlapping each of the ground patterns 61 in the Z-direction.

The pattern-side through-hole 12 penetrates a board body 63 and the ground pattern 61 of the printed circuit board 6, as illustrated in FIG. 4, and in the present embodiment, has a circular planar shape. The planar shape of the pattern-side through-hole 12 is circular in the present embodiment, but only needs to be a round shape, such as an oval shape, in the present disclosure. The inside diameter of the pattern-side through-hole 12 is greater than the outside diameter of the screw member 11. The pattern-side through-hole 12 allows the screw member 11 to penetrate the inside thereof.

The cover-side coupling piece 13 continues to an outer edge of the shielding cover 7 and is formed into a plate shape parallel to the XY-plane, in the present embodiment. In the present embodiment, the cover-side coupling piece 13 is provided so as to be integrated with the shielding cover 7. The planar shape of the cover-side coupling piece 13 is smaller than that of the ground pattern 61. The cover-side coupling piece 13 is disposed in a position overlapping the ground pattern 61 in the Z-direction.

The cover-side coupling piece 13 has a cover-side through-hole 131 that allows the screw member 11 to pass therethrough. The cover-side through-hole 131 is provided in the shielding cover 7 and overlaps the ground pattern 61 when viewed in the Z-direction. The cover-side through-hole 131 penetrates the cover-side coupling piece 13 and, in the present embodiment, has a circular planar shape. The planar shape of the cover-side through-hole 131 is circular in the present embodiment, but only needs to be a round shape, such as an oval shape, in the present disclosure. The inside diameter of the cover-side through-hole 131 is greater than the outside diameter of the screw member 11.

The nut 14 is screwed onto the screw member 11 passing through the pattern-side through-hole 12 and the cover-side through-hole 131. In the present embodiment, the nut 14 is a flange nut having a ring-like flange 141. The outside diameter of the flange 141 of the nut 14 is greater than the inside diameters of the through-holes 12 and 131.

The projecting portion 15 is provided in an area surrounding the cover-side through-hole 131 of the cover-side coupling piece 13 as illustrated in FIG. 5, and project from the cover-side coupling piece 13 toward the ground pattern 61 as illustrated in FIG. 6. The display device 100 includes at least two projecting portions 15, and the cover-side through-hole 131 is interposed between the projecting portions 15. In the present embodiment, four projecting portions 15 are provided at even intervals in a circumferential direction about the cover-side through-hole 131 serving as the center. In the plan view as illustrated in FIG. 3, the projecting portions 15 are provided in an area of the cover-side coupling piece 13 overlapping the flange 141 of the nut 14 screwed onto the screw member 11.

In the present embodiment, the projecting portions 15 are bent such that portions of a base material of the cover-side coupling piece 13 located at an inner edge of the cover-side through-hole 131 are located closer to the ground pattern 61 than the other portions of the base material. In the present embodiment, the projecting portions 15 are formed by blanking and bending the metal plate-like member to form the shielding cover 7 and the cover-side coupling pieces 13, and then by pressing the cover-side coupling pieces 13.

In the present embodiment, as illustrated in FIG. 5, the planar shape of each of the projecting portions 15 is formed into a triangular shape that gradually becomes narrower in width in the plan view from the inner edge of the cover-side through-hole 131 toward the outer periphery of the cover-side through-hole 131. In the present embodiment, as illustrated in FIG. 6, the projecting portions 15 gradually decrease in projection amount from the inner edge of the cover-side through-hole 131 toward the outer periphery of the cover-side through-hole 131.

The step portion 16 is provided on the backlight unit 5 around the screw member 11 so as to project from the backlight unit 5 toward the printed circuit board 6. The step portion 16 has a surface 161 parallel to the ground pattern 61 (that is, parallel to the XY-plane). In the embodiment, the planar shape of the step portion 16 is a circular shape disposed coaxially with the screw member 11 and having an outside diameter greater than that of the flange 141 of the nut 14.

As illustrated in FIG. 4, the step portion 16 is formed such that a portion 521 of a base material of the back plate 52 located around the screw member 11 is formed so as to project toward the printed circuit board 6 higher than another portion 522 of the base material does. At the step portion 16, the insulating film 53 is provided on the portion 521 of the base material of the back plate 52. The other portion 522 is more distant than the portion 521 from the screw member 11. A projection amount P of the portion 521 of the back plate 52 at the step portion 16 from the other portion 522 is greater than a thickness T of the insulating film 53.

As illustrated in FIG. 4, the coupling portion 1 having the above-described configuration is assembled by sequentially putting the screw member 11 through the pattern-side through-hole 12 and the cover-side through-hole 131, sequentially stacking the printed circuit board 6 and the cover-side coupling piece 13 on the surface 161 of the step portion 16, and screwing the nut 14 to the screw member 11. When the coupling portion 1 is assembled by screwing the nut 14 to the screw member 11, the cover-side coupling piece 13 overlaps the ground pattern 61, and the projecting portions 15 provided at the cover-side coupling piece 13 bite into the ground pattern 61 to electrically couple the shielding cover 7 to the ground pattern 61.

When the coupling portion 1 is assembled by screwing the nut 14 to the screw member 11, the backlight unit 5, the printed circuit board 6, and the shielding cover 7 are fastened to one another. FIG. 3 illustrates the example in which the screw member 11 is coaxial with the pattern-side through-hole 12 and the cover-side through-hole 131. However, in the present disclosure, the position of the screw member 11 relative to the pattern-side through-hole 12 and the cover-side through-hole 131 is not limited to that of the example illustrated in FIG. 3.

In general, the display panel 3 is relatively prone to be charged with static electricity, and the static electricity may cause a malfunction of the electronic components of the printed circuit board 6 for driving the elements for display unless a countermeasure against the static electricity is taken. In contrast, in the display device 100 of the present embodiment, the shielding cover 7 is provided with the projecting portions 15, and the projecting portions 15 bite the ground pattern 61 to reduce contact resistance between the shielding cover 7 and the ground pattern 61. As a result, in the display device 100, the ground pattern 61 of the printed circuit board 6 can be electrically coupled to the shielding cover 7 in a stable manner, and the electronic components of the printed circuit board 6 can be less probable to malfunction.

In the display device 100, the projecting portions 15 are provided in the positions at which the cover-side through-hole 131 is interposed therebetween. In the display device 100, the projecting portions 15 are provided in the area overlapping the flange 141 of the nut 14. With this configuration, in the display device 100, the nut 14 screwed onto the screw member 11 penetrating the inside of the cover-side through-hole 131 presses the projecting portions 15 in the direction of biting the ground pattern 61. As a result, in the display device 100, the ground pattern 61 of the printed circuit board 6 can be electrically coupled to the shielding cover 7 in a stable manner.

In the display device 100, the back plate 52 of the backlight unit 5 is provided with the step portion 16, and the surface 161 of the step portion 16 is parallel to the XY-plane. As a result, in the display device 100, a force of the nut 14 pressing the projecting portions 15 can act in the direction of biting the ground pattern 61, and the ground pattern 61 of the printed circuit board 6 can be electrically coupled to the shielding cover 7 in a stable manner.

In the display device 100, the projection amount P of the step portion 16 is greater than the thickness T of the insulating film 53. Therefore, the surface 161 of the step portion 16 can continue to be contact with the printed circuit board 6 even if the insulating film 53 is crushed by the nut 14.

While the preferred embodiment has been described above, the present disclosure is not limited to such an embodiment. The content disclosed in the embodiment is merely an example and can be variously modified within the scope not departing from the gist of the present disclosure. Any modifications made as appropriate within the scope not departing from the gist of the present disclosure naturally belong to the technical scope of the present disclosure. For example, an electronic apparatus to which the shielding cover 7 according to the above-described embodiment is applicable is not limited to the display device 100. The shielding cover 7 is also applicable to other electronic apparatuses and may be applicable to a display panel that lights up a self-luminous body, such as an organic light emitting diode (OLED), or to an electrophoretic display panel.

Other operational advantages accruing from the aspects described in the present embodiment that are obvious from the description herein, or that are conceivable as appropriate by those skilled in the art will naturally be understood as accruing from the present disclosure.

What is claimed is:
1. A display device comprising:
a light source provided on a back surface side of a display panel;
a printed circuit board provided on a back surface side of the light source;
a shielding cover that covers the printed circuit board;
a screwing member; and
a projecting portion,
wherein a surface of the printed circuit board facing the shielding cover is provided with a ground pattern electrically coupled to the shielding cover,
wherein the ground pattern has a pattern-side through-hole therein, and the pattern-side through-hole penetrates the ground pattern and allows a screw member to pass therethrough,
wherein the shielding cover has a cover-side through-hole therein, and the cover-side through-hole overlaps the ground pattern and allows the screw member to pass therethrough, wherein the screwing member is screwed onto the screw member passing through the pattern-side through-hole and the cover-side through-hole, and wherein the projecting portion is provided in an area surrounding the cover-side through-hole and projects toward the ground pattern.

2. The display device according to claim 1, wherein the display device comprises at least two of the projecting portions, and the cover-side through-hole is interposed between the projecting portions.

3. The display device according to claim 1, wherein the projecting portion is provided in an area overlapping the screwing member.

4. The display device according to claim 1, further comprising a step portion that is provided on the light source around the screw member so as to project from the light source toward the printed circuit board, wherein the step portion has a surface parallel to the ground pattern.

5. The display device according to claim 4, wherein the light source comprises a sheet metal and an insulating film provided on at least a portion of a surface of the sheet metal facing the printed circuit board, wherein the step portion is a portion of the sheet metal that projects toward the printed circuit board higher than another portion thereof does, the step portion having the insulating film provided thereon, and wherein a projection amount of the portion from the other portion is greater than a thickness of the insulating film.

* * * * *